(12) United States Patent
Sewelll

(10) Patent No.: US 7,331,283 B2
(45) Date of Patent: Feb. 19, 2008

(54) METHOD AND APPARATUS FOR IMPRINT PATTERN REPLICATION

(75) Inventor: Harry Sewelll, Ridgefield, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 11/012,598

(22) Filed: Dec. 16, 2004

(65) Prior Publication Data

US 2006/0130678 A1    Jun. 22, 2006

(51) Int. Cl.
*B41M 1/10* (2006.01)

(52) U.S. Cl. .................. 101/3.1; 101/453; 101/454; 430/5; 430/322; 430/323; 430/330; 264/293; 425/406

(58) Field of Classification Search .............. 430/5, 430/20, 22, 322, 323, 330; 101/3.1, 454, 101/453; 264/293, 320, 339, 313; 425/406
See application file for complete search history.

(56) References Cited

U.S. PATENT DOCUMENTS

| | | | |
|---|---|---|---|
| 5,669,303 | A | 9/1997 | Maracas et al. |
| 5,772,905 | A | 6/1998 | Chou |
| 6,238,271 | B1 | 5/2001 | Cesna |
| 6,365,059 | B1 | 4/2002 | Pechenik |
| 6,399,173 | B1 | 6/2002 | Nagayama et al. |
| 6,482,742 | B1 | 11/2002 | Chou |
| 6,507,456 | B1 | 1/2003 | Dinan et al. |
| 6,518,189 | B1 | 2/2003 | Chou |
| 6,531,202 | B1 | 3/2003 | Litvinov et al. |
| 6,601,629 | B2 * | 8/2003 | Toyoda et al. ............. 156/540 |
| 6,656,021 | B2 | 12/2003 | Ota et al. |
| 6,740,209 | B2 | 5/2004 | Shibamoto et al. |
| 6,743,368 | B2 | 6/2004 | Lee |
| 6,757,116 | B1 | 6/2004 | Curtiss et al. |
| 6,809,356 | B2 | 10/2004 | Chou |
| 6,814,898 | B1 | 11/2004 | Deeman et al. |
| 6,869,557 | B1 | 3/2005 | Wago et al. |
| 6,951,173 | B1 | 10/2005 | Meissl et al. |

(Continued)

FOREIGN PATENT DOCUMENTS

EP    0 617 457 A2    9/1994

(Continued)

OTHER PUBLICATIONS

Moritz, J. et al., "Patterned Media Made From Pre-etched Wafers: A Promising Route Toward Ultrahigh-Density Magnetic Recording," *IEEE Transactions on Magnetics*, vol. 38, No. 4, pp. 1731-1736 (Jul. 2002).

(Continued)

*Primary Examiner*—Daniel J. Colilla
*Assistant Examiner*—Kevin D. Williams
(74) *Attorney, Agent, or Firm*—Sterne, Kessler, Goldstein & Fox P.L.L.C.

(57) ABSTRACT

Provided is a method and system for imprinting a pattern formed on a surface of an imprint mask into a substrate. A method includes deforming at least one of the surface of the imprint mask and a surface of the substrate to produce a deformed surface having an arc therein. A clamping pressure is applied to bring the deformed surface into intimate contact with the other surface, the applied pressure substantially flattening the deformed surface. The applied clamping pressure is released to separate the two surfaces.

10 Claims, 4 Drawing Sheets

U.S. PATENT DOCUMENTS

| | | |
|---|---|---|
| 6,964,793 B2 | 11/2005 | Willson et al. |
| 2002/0114978 A1 | 8/2002 | Chang et al. |
| 2003/0017424 A1* | 1/2003 | Park et al. ............... 430/322 |
| 2003/0091865 A1 | 5/2003 | Chen et al. |
| 2003/0104316 A1 | 6/2003 | Wang et al. |
| 2003/0127007 A1 | 7/2003 | Sakurai et al. |
| 2003/0203319 A1 | 10/2003 | Lee |
| 2004/0090610 A1 | 5/2004 | Hatakeyama et al. |
| 2004/0101713 A1 | 5/2004 | Wachenschwanz et al. |
| 2004/0124566 A1 | 7/2004 | Sreenivasan et al. |
| 2004/0132301 A1 | 7/2004 | Harper et al. |
| 2004/0146792 A1* | 7/2004 | Nimmakayala et al. ....... 430/22 |
| 2004/0169441 A1 | 9/2004 | Choi et al. |
| 2004/0182820 A1 | 9/2004 | Motowaki et al. |
| 2004/0195202 A1 | 10/2004 | Pechenik |
| 2004/0197712 A1 | 10/2004 | Jacobson et al. |
| 2004/0202865 A1 | 10/2004 | Homola et al. |
| 2004/0209123 A1 | 10/2004 | Bajorek et al. |
| 2004/0211755 A1 | 10/2004 | Yusa et al. |
| 2005/0116370 A1 | 6/2005 | Ogino et al. |
| 2005/0118817 A1 | 6/2005 | Fujita et al. |
| 2005/0130074 A1 | 6/2005 | Krause et al. |
| 2005/0133954 A1 | 6/2005 | Homola |
| 2005/0146078 A1 | 7/2005 | Chou et al. |
| 2005/0150862 A1 | 7/2005 | Harper et al. |
| 2005/0151282 A1 | 7/2005 | Harper et al. |
| 2005/0151300 A1 | 7/2005 | Harper et al. |
| 2005/0155554 A1 | 7/2005 | Saito |
| 2005/0156342 A1 | 7/2005 | Harper et al. |
| 2005/0158163 A1 | 7/2005 | Harper et al. |
| 2005/0167847 A1 | 8/2005 | Olsson |
| 2005/0172848 A1 | 8/2005 | Olsson |
| 2005/0191418 A1 | 9/2005 | Bietsch et al. |
| 2005/0212178 A1 | 9/2005 | Nien et al. |
| 2006/0130317 A1 | 6/2006 | Sewell |
| 2006/0131270 A1 | 6/2006 | Sewell |
| 2006/0131785 A1 | 6/2006 | Sewell |
| 2007/0121375 A1 | 5/2007 | Sewell |

FOREIGN PATENT DOCUMENTS

| | | |
|---|---|---|
| EP | 1 072 954 A2 | 1/2001 |
| WO | WO 01/59523 A1 | 8/2001 |
| WO | WO 02/42844 A2 | 5/2002 |
| WO | WO 02/42844 A3 | 5/2002 |
| WO | WO 02/091460 A2 | 11/2002 |
| WO | WO 02/091460 A3 | 11/2002 |
| WO | WO 03/099463 A2 | 12/2003 |
| WO | WO 03/099463 A3 | 12/2003 |
| WO | WO 2004/013697 A2 | 2/2004 |
| WO | WO 2004/013697 A3 | 2/2004 |
| WO | WO 2004/021083 A1 | 3/2004 |
| WO | WO 2004/099879 A2 | 11/2004 |

OTHER PUBLICATIONS

Harry Sewell, U.S. Appl. No. 11/288,135, filed Nov. 29, 2005, entitled "System and Method for Forming Nanodisks Used in Imprint Lithography and Nanodisk and Memory Disk Formed Thereby".

Requirement for Restriction/Election for U.S. Appl. No. 11/012,474, mailed on Jul. 6, 2007.

First Non-Final Rejection for U.S. Appl. No. 11/012,489, mailed on Dec. 19, 2006.

Final Rejection for U.S. Appl. No. 11/012,489, mailed on Jun. 15, 2007.

Non-Final Rejection for U.S. Appl. No. 11/224,316, mailed Jul. 3, 2007.

International Search Report and Written Opinion for International Application No. PCT/US05/45458 mailed Sep. 4, 2007, 8 pgs.

Notice of Allowability for U.S. Appl. No. 11/288,135, mailed Aug. 6, 2007.

Non-Final Rejection for U.S. Appl. No. 11/012,489, mailed Oct. 29, 2007.

* cited by examiner

METHOD AND APPARATUS FOR IMPRINT PATTERN REPLICATION

BACKGROUND OF THE INVENTION

1. Field of the Invention

The present invention relates generally to the field of forming lithographic patterns using imprint masks.

2. Related Art

Resin material can be imprinted with patterns, for example, from etched quartz stamps. Both ultra-violet (UV) curable and thermally deformable resins have traditionally been used this capacity.

With the traditional used UV curable and thermally deformable resins, separating the stamp from the resin, after imprinting, can be particularly problematic. That is, it is difficult to separate the resin and the stamp in a way that is not impeded by the stamp sticking to the resin, particularly when a vacuum has been used to aid the impress process.

What is needed, therefore, is a system and method to alleviate the challenge of separating a stamp from the resin after an imprint stamp is used to imprint a pattern into the resin.

BRIEF SUMMARY OF THE INVENTION

Consistent with the principles of the present invention, as embodied and broadly described herein, the present invention includes a method for imprinting a pattern formed on a surface of an imprint mask into a substrate. The method includes deforming at least one of the surface of the imprint mask and a surface of the substrate to produce a deformed surface having an arc therein. A clamping pressure is applied to bring the deformed surface into intimate contact with the other surface, the applied pressure substantially flattening the deformed surface. To separate the two surfaces, the applied clamping pressure is released.

Further features and advantages of the present invention as well as the structure and operation of various embodiments of the present invention, as described in detail below with reference to the accompanying drawings.

BRIEF DESCRIPTION OF THE DRAWINGS/FIGURES

The accompanying drawings which are incorporated herein and constitute part of the specification, illustrate embodiments of the present invention and, together with the general description given above and the detailed description of the embodiments given below, serve to explain the principles of the invention. In the drawings.

DETAILED DESCRIPTION OF THE INVENTION

Figure 1:
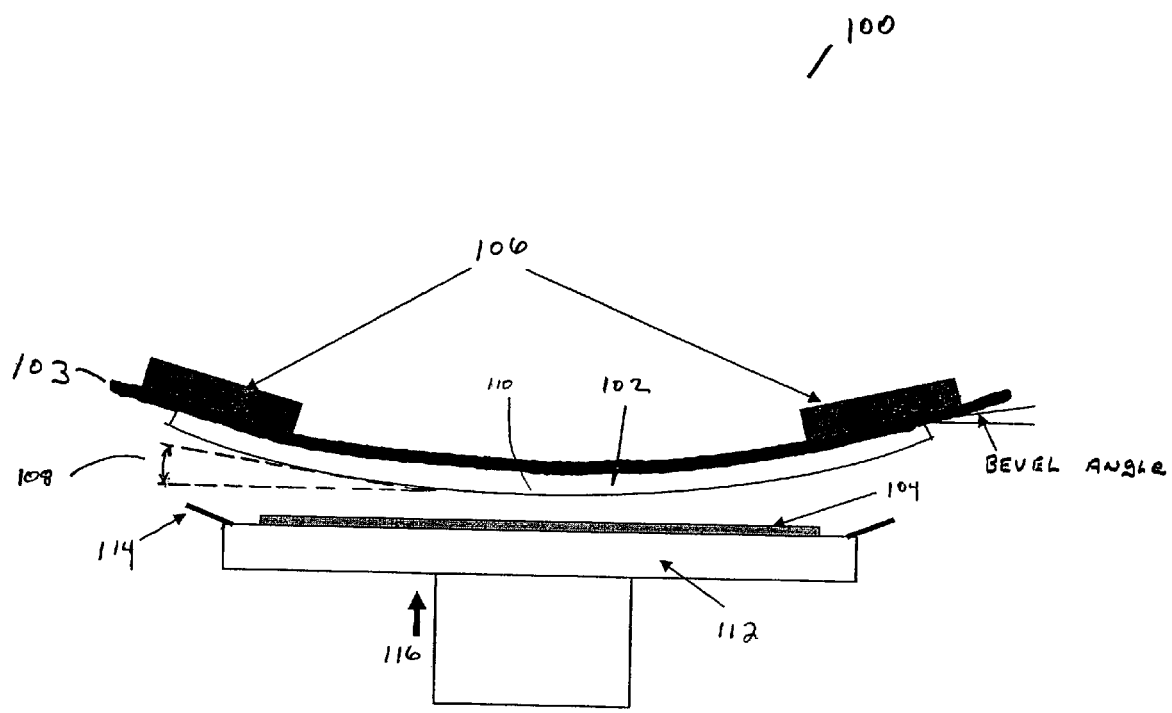
FIG. 1 is an illustration of an exemplary apparatus including an imprint stamp and substrate arranged in accordance with an embodiment of the present invention.

The following detailed description of the present invention refers to the accompanying drawings that illustrate exemplary embodiments consistent with this invention. Other embodiments are possible, and modifications may be made to the embodiments within the spirit and scope of the invention. Therefore, the following detailed description is not meant to limit the invention. Rather, the scope of the invention is defined by the appended claims.

It would be apparent to one skilled in the art that the present invention, as described below, may be implemented in many different embodiments of hardware and/or the entities illustrated in the drawings. Thus, the operation and behavior of the present invention will be described with the understanding that modifications and variations of the embodiments are possible, given the level of detail presented herein.

In an exemplary embodiment of the present invention, a curvature or bow is created in the imprint stamp that allows the stamp to be separated from the resin with an unzipping action. Once separated from the stamp, the substrate can be unloaded from the apparatus undamaged. The curvature or bow is instrumental in providing a clean separation of the stamp and substrate particularly on large substrates.

FIG. 1 is an illustration of an exemplary apparatus 100 including an imprint stamp 102 and a substrate (e.g., a resin) 104 arranged in accordance with an embodiment of the present invention. In FIG. 1 the imprint stamp 102 can be, for example, a nano-plate imprint stamp (i.e., having nano-scale features on the orders of a few hundreds of millimeters line width).

Uses and manufacturing of nano-plate imprint stamps are described in U.S. Patent Application entitled METHOD AND SYSTEM FOR MAKING A NANO-PLATE FOR IMPRINT LITHOGRAPHY, U.S. application Ser. No. 11/012,489, filed Dec. 16, 2004 and U.S. Patent Application entitled METHOD AND SYSTEM FOR MAKING A COMPUTER HARD DRIVE PLATEN USING A NANO-PLATE, U.S. Appl. Ser. No. 11/012,474, filed Dec. 16, 2004, both of which are assigned to the assignee of the present invention and are incorporated herein by reference. The imprint stamp 102 includes a pattern that is to be printed onto the substrate 104. The use of vacuums is well know in the semiconductor manufacturing art.

The imprint stamp 102 is fastened onto a mask holder platen 103 using vacuum lands 106. The imprint stamp 102 is fastened onto the mask holder platen 103 in such a way as to create a bow in the stamp profile. In the embodiment of FIG. 1, the imprint stamp 102 is held by vacuum against vacuum lands that are out of planar. Deviation 108 from planar is quite small, but is sufficient to deviate a center portion 110 of the stamp 102 many microns out of flat. This bow or curvature, that has been introduced in the stamp ensures that when the stamp 102 and the substrate 104 are brought together, it is the center portion 110 of the stamp 102 that makes contact with the substrate 104 first.

The substrate 104, which is to be impressed, is mounted onto a substrate platen 112. The substrate platen 112 need not be flat. That is, the substrate platen 112 can also have a bow built into it which will also allow the central region of the substrate 104 to meet the central portion 110 of the stamp 102 first.

During an actual imprinting procedure, the stamp 102 and the substrate 104 are pressed together with enough force 116 to conform the entire surface of both the stamp 102 and the substrate 104 together in intimate contact. Effectively the bow introduced into the stamp is substantially flattened out by the clamping pressure. Further clamping pressure can be applied using a vacuum seal 114 and then by drawing a vacuum between the substrate 104 and the imprint stamp 102.

Figure 2:
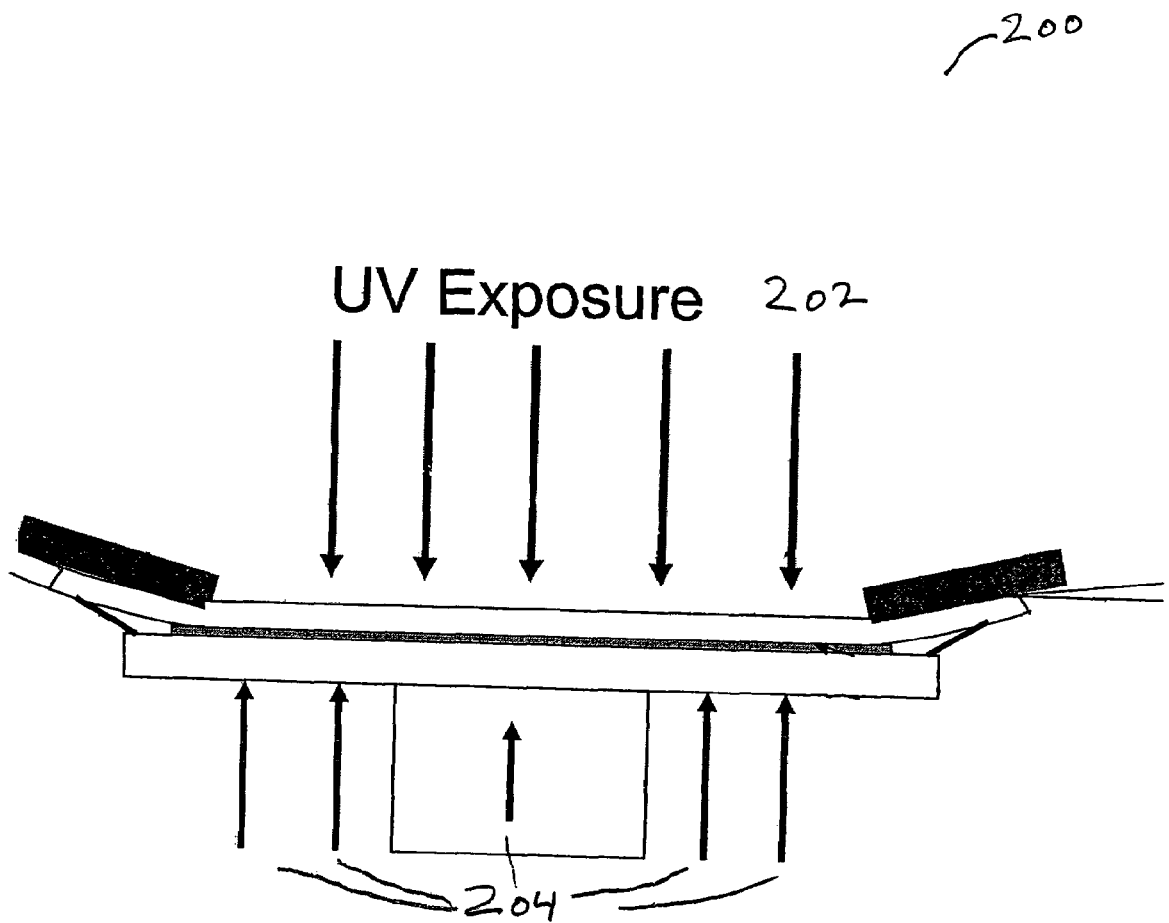
FIG. 2 is an illustration of the stamp and substrate illustrated in FIG. 1 being exposed to ultra-violet (UV) radiation (UV exposure not required for thermal imprints)

FIG. 2 is an illustration 200 of the stamp 102 and the substrate 104, shown in FIG. 1, being exposed to ultra-violet (UV) radiation 202. That is, the pattern transfer into the resin 104 can be further facilitated by flood exposing, for example, a UV-cure type resin with UV light through the imprint stamp 102 into the substrate 104. The UV exposure 202 cross-links the resin 104 and helps to solidify the resin 104.

Although FIG. 2 provides an illustration of a UV-curable resin, the present invention is not limited to this approach. For example, the principle of deforming the imprint stamp 102 and/or the substrate 104 with a bow is also applicable using a thermal resin. With thermal resin the substrate and imprint mask are brought together at an elevated temperature which is sufficient to soften the resin. When softened through heating, the pattern from the imprint stamp 102 can be physically pressed into the softened resin 104 by applying pressure 204 and the pattern printed. Using a thermal resin, no U-V exposure is required to cure the resin. Both the stamp 102 and the substrate platen 112 are typically heated and temperature controlled in the case of thermal imprinting.

Figure 3:
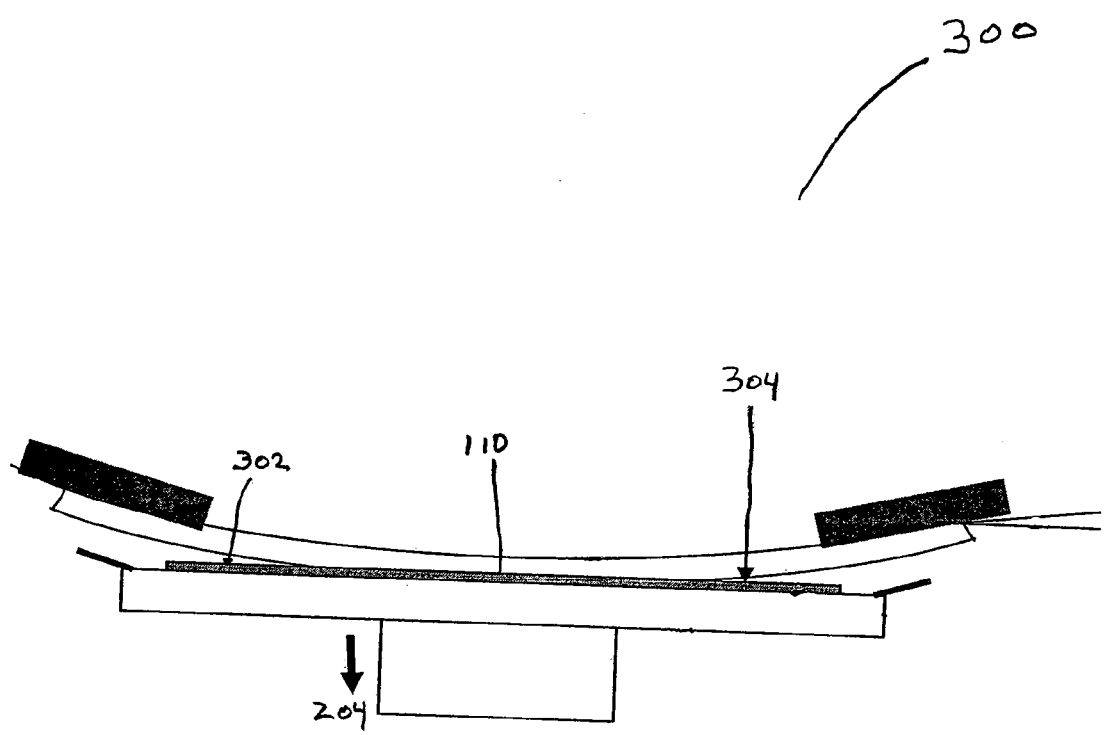
FIG. 3 is an illustration of the stamp being separated from the resin in accordance with the present invention.

FIG. 3 is an illustration of the imprint stamp 102 being separated from the substrate 104 in accordance with the present invention. The release of the vacuum and reduction of the pressure 204 between the stamp 102 and the substrate 104 initiates the separation process. The imprint stamp 102 and the substrate 104 begin to separate, or peel apart, at the outer edges 302 and 304 first. The separation progresses to the center portion 110 of the substrate 104 in a carefully controlled manner as the pressure is fully released. There is an unzipping, or peeling back action, as opposed to a straight pull off, to separate substrate 104 and the imprint stamp 102. This action is essential to the keeping of nanometer sized imprinted patterns transferred to the substrate 104 in place and undamaged.

Once separated from the imprint stamp 102 the substrate 104 can be unloaded from the apparatus 100. In some cases the substrate 104 can be a disk, or a disk having a hole through its center.

Figure 4:
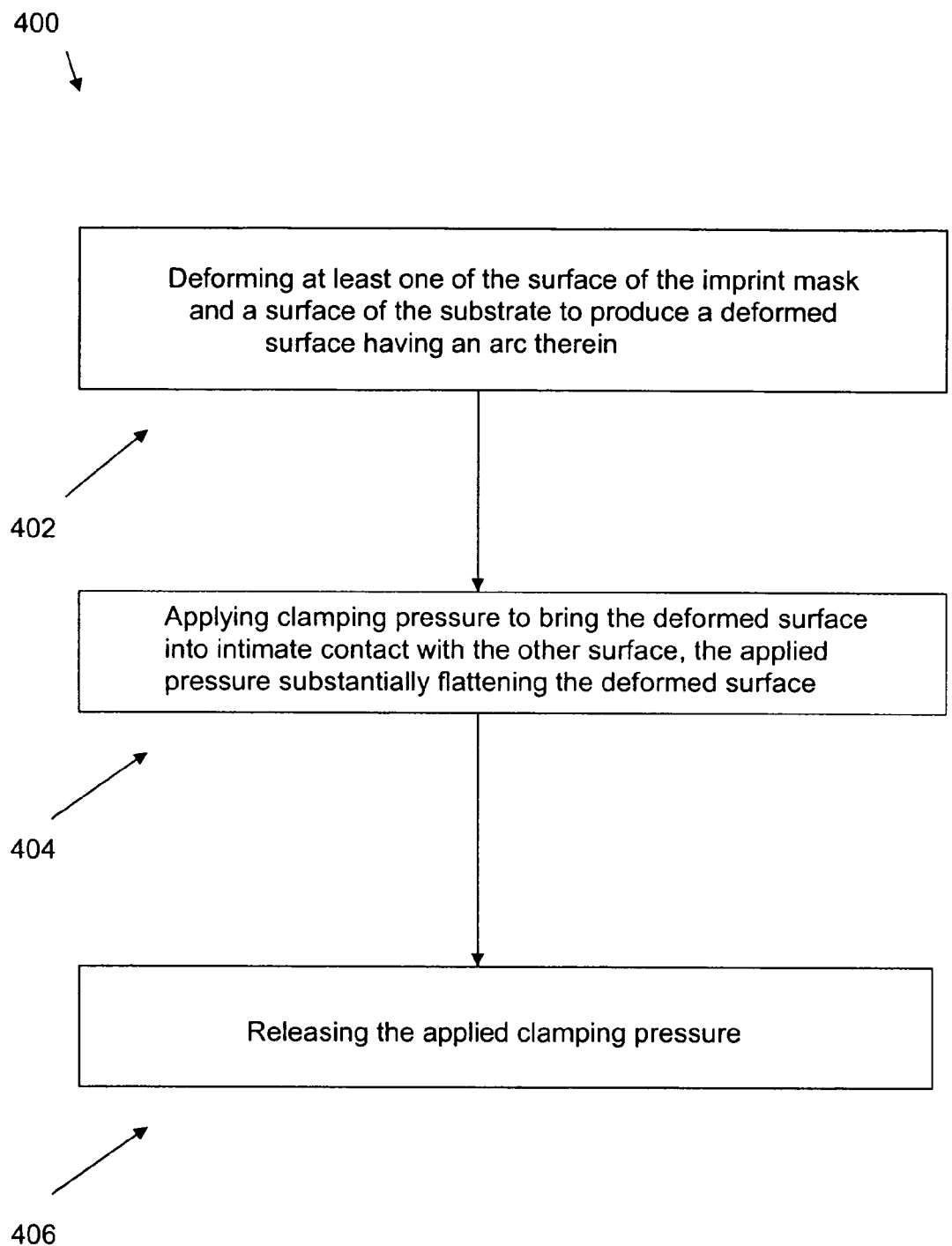
FIG. 4. is a flowchart of an exemplary method of practicing an embodiment of the present invention.

FIG. 4. is a flowchart of an exemplary method 400 of practicing an embodiment of the present invention. In FIG. 4, at least one of a surface of an imprint stamp and a substrate is, deformed to provide a deformed surface having an arc therein, as indicated in step 402. In step 404, a clamping pressure is applied to bring the deformed surface into intimate contact with the other surface, the applied pressure substantially flattening the deformed surface. To separate the two surfaces, the applied clamping pressure is released, as indicated in step 406.

CONCLUSION

The present invention provides an imprint stamp clamping configuration which creates a bow or curvature in at least one of an imprint stamp or a substrate. The curvature enables a clean separation and high fidelity liftoff between the stamp and the substrate.

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed.

Any such alternate boundaries are thus within the scope and spirit of the claimed invention. Thus, the breadth and scope of the present invention should not be limited by any of the above-described exemplary embodiments, but should be defined only in accordance with the following claims and their equivalents.

The foregoing description of the specific embodiments will so fully reveal the general nature of the invention that others can, by applying knowledge within the skill of the art (including the contents of the references cited herein), readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance presented herein, in combination with the knowledge of one of ordinary skill in the art.

The Detailed Description section should primarily be used to interpret the claims. The Summary and Abstract sections may set forth one or more, but not all exemplary embodiments of the present invention as contemplated by the inventor(s), and thus, are not intended to limit the claims.

What is claimed is:

1. A method for imprinting a pattern formed on a surface of an imprint mask on a substrate, the method comprising:
    coupling the imprint mask to a curved mask support, such that the surface having the pattern is a deformed surface having an arc therein;
    applying clamping pressure to conform the deformed surface and a substrate surface together into intimate contact, the applied clamping pressure substantially flattening the deformed surface; and
    releasing the applied clamping pressure, the releasing initiating separation of the deformed surface from the substrate surface.

2. The method of claim 1, further comprising exposing the substrate to ultra-violet light prior to the releasing step.

3. The method of claim 1, further comprising heating at least one of the substrate and the imprint mask prior to the applying step.

4. The method of claim 1, wherein the coupling step comprises using vacuum lands on the curved mask support to hold the imprint mask to the curved mask support.

5. The method of claim 1, wherein the substrate has a complementary shape to the deformed surface.

6. A system, comprising:
    an imprint mask including a pattern formed on a surface thereof;
    a curved mask support coupled to the imprint mask, such that the surface including the pattern is a deformed surface having an arcuate profile;
    a substrate including a surface configured to receive the deformed surface of the imprint mask;
    a clamping device configured to apply clamping pressure between the imprint mask and the substrate, such that the deformed surface is substantially flattened against the substrate surface; and
    a releasing device configured to release the applied clamping pressure to initiate separation of the deformed surface from the substrate surface.

7. The system of claim 6, further comprising:
an ultra violet source configured to expose the substrate to ultra-violet light prior to releasing the applied clamping pressure.

8. The system of claim 6, further comprising:
a heater configured to heat at least one of the substrate and the imprint mask prior to applying the clamping pressure.

9. The system of claim 6, wherein the curved mask support comprises vacuum lands configured to hold the imprint mask to the curved mask support.

10. The system of claim 6, wherein the substrate has a complementary shape to the deformed surface.

* * * * *

UNITED STATES PATENT AND TRADEMARK OFFICE
CERTIFICATE OF CORRECTION

PATENT NO.         : 7,331,283 B2                                           Page 1 of 1
APPLICATION NO.  : 11/012598
DATED              : February 19, 2008
INVENTOR(S)        : Harry Sewell It is certified that error appears in the above-identified patent and that said Letters Patent is hereby corrected as shown below:

On the Title Page, at item (12), please replace "Sewelll" with --Sewell--.

On the Title Page, at item (75), Inventor section, please replace "Harry Sewelll" with --Harry Sewell--.

Signed and Sealed this

Twenty-second Day of July, 2008

JON W. DUDAS
*Director of the United States Patent and Trademark Office*